(12) United States Patent
Eleftheriou et al.

(10) Patent No.: US 6,895,547 B2
(45) Date of Patent: May 17, 2005

(54) METHOD AND APPARATUS FOR LOW DENSITY PARITY CHECK ENCODING OF DATA

(75) Inventors: Evangelos Stavros Eleftheriou, Zurich (CH); Richard Leo Galbraith, Rochester, MN (US); Sedat Oelcer, Au (CH)

(73) Assignee: International Business Machines Corporation, Armonk, NY (US)

(*) Notice: Subject to any disclaimer, the term of this patent is extended or adjusted under 35 U.S.C. 154(b) by 342 days.

(21) Appl. No.: 09/902,859

(22) Filed: Jul. 11, 2001

(65) Prior Publication Data
US 2003/0037298 A1 Feb. 20, 2003

(51) Int. Cl.[7] ............................................... G06F 11/00
(52) U.S. Cl. ..................................................... 714/801
(58) Field of Search .............................. 714/799, 801, 714/781

(56) References Cited

PUBLICATIONS

Bond et al., Low density parity check codes based on sparse matrices with no small cycles, 1997, Proceedings of the 6th IMA international Conference, p. 47–58.*

Bond et al., Constructing low density parity check codes, 2000, IEEE, p. 260–262.*

Zhang et al., A class of efficient–encoding generalized low density parity check codes, 2001, IEEE, p. 24772480.*

Richardson et al., Efficient encoding of low density parity check codes, 2001, IEEE, p. 638–656.*

* cited by examiner

*Primary Examiner*—Shelly A Chase
(74) *Attorney, Agent, or Firm*—Douglas W. Cameron; Anne V. Dougherty (57) ABSTRACT

A method for low-density parity-check (LDPC) encoding of data comprises defining a first M×N parity check matrix; generating, based on the first parity check matrix, a second parity check matrix having an M×M triangular sub-matrix; and, mapping the data into an LDPC code word based on the second parity check matrix. The method is particularly useful for data communications applications, but may also be employed in other applications such as, for example, data storage.

14 Claims, 4 Drawing Sheets

METHOD AND APPARATUS FOR LOW DENSITY PARITY CHECK ENCODING OF DATA

BACKGROUND OF THE INVENTION

1. Technical Field

The present invention generally relates to a method and apparatus for low-density parity-check (LDPC) encoding of data and particularly relates to block encoding of data based on a parity check matrix for mapping the data into LDPC code words for binary and multilevel modulation for data communication and for recording systems.

2. Description of Related Art

In Gallager: "*Low-density parity-check codes*, Cambridge, Mass. MIT Press 1963.", it is shown that, based on message-passing decoders, it is possible to come extremely close to the channel capacity of the binary-input additive white Gaussian noise channel (AWGN). Since then, it has been shown that LDPC codes can come very close to capacity on many practical communication and recording channels. Therefore, LDPC codes have been considered as an alternative to turbo codes. Specifically, LDPC codes exhibit a better asymptotic performance than turbo codes, they are less affected by error floors, and offer a variety of tradeoffs between decoder complexity and performance. An advantage of LDPC codes is the low implementation complexity of the sum-product algorithm that is used to decode them. Simplified versions of the sum-product algorithm drive complexity lower with negligible loss in decoding performance as compared to full sum-product decoding.

In many magnetic recording applications such as hard-disk drives or tape systems, information is stored in binary form. In these applications, inner modulation codes concatenated with outer Reed-Solomon codes are employed to provide reliable extraction of the written information. Turbo and LDPC codes may push the areal density of magnetic recording systems to the limit for presently available magnetic components. It has been shown that, despite present sector-size constraints of hard-disk drives limiting the block length of a code and the high code-rate requirement, simple iterative decoding schemes can bring performance within approximately 1.5 dB of the theoretical limit. This represents a significant gain compared to existing systems. High-rate LDPC codes appear to have advantages over convolutional or turbo codes when used as outer codes in a magnetic recording system. For example, LDPC codes do not seem to suffer from error floors at error rates of $10^{-8}$. Furthermore, the sparseness of the parity-check matrix of LDPC codes results in decoding algorithms that are less complex compared to serially concatenated systems with convolutional outer codes. Also, no interleaver is needed between the LDPC encoder and the channel, because interleaving can be implicitly incorporated into the LDPC code. The potential gains of LDPC codes over the traditional Reed-Solomon codes for the magnetic recording channel have been presented in, T. Mittelholzer, A. Dholakia, and E. Eleftheriou "*Reduced-Complexity Iterative Decoding of Low Density Parity Check Codes for Generalized Partial Response Channels,*" IEEE Trans. Magn., 37(2), pp. 721–728, March 2001. In magnetic is storage systems LDPC codes are expected to push the areal density to its ultimate limit.

In many communication systems, including both wired and wireless transmission systems, there are strict limitations on transmit signal bandwidth. Such limitations impose a demand for signal modulation with a number of levels greater than two. Many conventional systems employ Trellis-coded modulation (TCM) in such applications. However, a problem associated with TCM is that it is unsuitable for iterative decoding. Therefore, farther improvements in signal quality at an acceptable complexity are difficult to achieve.

"*A turbo TCM scheme with low decoding complexity,*" Catena Netwoks Inc., Temporary Document BI-090, ITU-T Study Group 15, Question 4, Goa, India, 23–27 Oct. 2000, "*Proposal of decision making for turbo coding and report of performance evaluation of proposed TTCM(PCCC) with R-S code and without R-S code,*" Mitsubishi Electric Corp., Temporary Document BI-003, ITU-T Study Group 15, Goa, India, 23–27 Oct. 2000, and "*Results of the requirements requested in the coding ad hoc report,*" Vocal Technologies Inc., Temporary Document HC-073, ITU-T Study Group 15, Question 4, Huntsville, Canada, 31 Jul.–4 Aug. 2000, describe turbo-coding schemes for multilevel ADSL and VDSL transmission. These turbo-coding techniques involve encoding of the information bits by parallel concatenation of convolutional encoders in recursive systematic form and iterative decoding by one of several possible turbo-decoding techniques. "*Block product turbo codes for G.dmt.bis and G.lite.bis,*" Globespan Inc., Temporary Document BA-063, ITU-T Study Group 15, Question 4, Antwerp, Belgium, 19–23 Jun. 2000 describes the application of block product codes using component Bose-Chaudhuri-Hoequenghem (BCH) codes and their soft iterative decoding based on the Chase algorithm. These techniques offer some performance enhancements over Trellis coding at the expense of incurring additional complexity.

Application development relating to the alternative coding technique of LDPC codes, as described in R. G. Gallager, "*Low-density parity-check codes,*" IRE Trans. Info. Theogy, vol. IT-8 pp. 21–28 Jan. 1962, D. J. C. MacKay and R. M. Neal, "*Near Shannon limit performance of low density parity check codes, Electron. Lett.*, vol. 32, no. 18, pp. 1645–1646, Aug. 1996, D. J. C. MacKay. "*Good error-correcting codes based on very sparse matrices,*" IEEE Trans. on Inform. Theory, vol. 45, No. 2, pp. 399–431, Mar. 1999, and FOSSORIER, M. P. C., MIHALJEVIC. M., and IMAI, H.: "*Reduced complexity iterative decoding of low density parity check codes based on belief propagation*", IEEE Trans. Commun., 1999, 47, (5), pp. 673–680, has to date focussed on applications requiring binary modulation such as wireless systems or digital magnetic recording. LDPC codes can also, however, be applied to multilevel transmission.

K. R. Narayanan and J. Li, "*Bandwidth efficient low density parity check coding using multilevel coding and interative multistage decoding,*" Proc. Int. Symp. on Turbo-Codes, Brest, France, pp. 165–168. September 2000 describes a multilevel coding technique based on binary LDPC block codes. This technique uses LDPC block codes for bit-interleaved modulation or for multilevel coding with iterative multi-stage decoding. For bit-interleaved LDPC modulation according to this technique, all the bits used to select a multilevel symbol are LDPC code bits. For multi-level coding, several LDPC block codes are used as component codes in a multilevel scheme. This technique has the drawback of requiring more than one LDPC encoder/decoder, leading to substantial implementation complexity especially for long codes and/or large constellation sizes.

"*Low density parity check coded modulation for ADSL,*" Aware Inc., Temporary Document BI-081, ITU-T Study Group 15, Question 4, Goa, India, 23–27 Oct. 2000 also describes a multilevel coding technique based on binary LDPC block codes. This technique is similar to TCM, except that LDPC coding is employed instead of convolutional coding. In particular, set partitioning follows the same principle as that used in TCM. This technique has the drawback of requiring an additional Bose-Chaudhuri-Hoeguenghem (BCH) code which adds to system complexity. Also, set partitioning, as required in TCM and similar schemes, leads to poor performance for soft-decision based decoding techniques.

Temporary Document RN-25, ITU Telecommunications Standardization Sector, Study Group 15, New Jersey, USA, 21–25 May 2001 describes a deterministic LDPC methodology and its applications to ADSL and ADSL Lite transmission. The methodology proposed therein requires a pre-computation of the a generator matrix using, for example, Gaussian elimination. The encoding requires $O(N^2)$ operations.

Co-pending IBM patent application Ser. No. 10/045,810 describes a method for multilevel data communication comprising: dividing a set of information bits to be transmitted into a first group and a second group; encoding the first group to generate a block code; selecting a subset of symbols in a constellation of symbols in dependence on the block code according to a Gray-coded mapping function; selecting a symbol within the subset in dependence on the second group according to a Gray-coded mapping function; and, transmitting the selected symbol. This method offers superior performance in terms of achievable coding gains. The coding gains arise because block coding schemes can be decoded iteratively, thereby leading to substantial performance gains as compared to trellis-coded modulation. Particularly preferred embodiments of this method comprise multilevel encoding schemes based on LDPC codes or simple product codes that do not need interleaving and that can be decoded via the simple sum-product algorithm (SPA) or low-complexity derivatives thereof.

A disadavantage associated with LDPC codes is that they demand relatively high encoding complexity. When an LDPC code word is obtained by multiplying the information block with the generator matrix of the code, encoding requires $O(N^2)$ operations, where N is the length of the code. Such an encoding procedure is not "linear in time." Furthermore, there is a preprocessing step needed to compute the generator matrix of the code from the specified LDPC parity-check matrix. The computation of the generator matrix involves Gaussian elimination, which requires $O(N^3)$ operations. Even though the preprocessing can be performed once for a particular LDPC check matrix and can be carried out off line, the computation cost can be prohibitive when decoding for applications requiring selection of one of a family of parity check matrices. This is the case, for example, in XDSL where the code is selected on a per connection basis. The topic of efficient encoding for LDPC codes has been addressed in L. Ping, W. K. Leung, and N. Phamdo, "*Low density parity check codes with semi-random parity check matrix,*" *Electron. Letters*, Vol. 35, No. 1, pp. 38–39, $7^{th}$ Jan .1999; D. J. C. MacKay, S. T. Wilson, and M. C. Davey, "*Comparison of constructions of irregular Gallager codes,*" *IEEE Trans. on Communications*, Vol. 47, No. 10, pp. 1449–1454, October 1999; and, R. Richardson and R. L. Urbanke, "*Efficient encoding of low-density parity-check codes.*" *IEEE Trans. on Information Theory*, Vol. 47., No. 2, pp.638–656, February 2001.

In L. Ping, W. K. Leung, and N. Phamdo, "*Low density parity check codes with semi-random parity check matrix,*" *Electron. Letters*, Vol. 35, No. 1, pp. 38–39, $7^{th}$ Jan. 1999, the parity-check matrix of the LDPC code is "semi-random" in the sense that it includes a deterministic and a random part. The deterministic part is in a band-diagonal or "zigzag" form to allow efficient encoding. The rest of the parity-check matrix is created randomly by avoiding 4-cycles. In D. J. C. MacKay, S. T. Wilson, and M. C. Davey, "*Comparison of constructions of irregular Gallager codes,*" *IEEE Trans. on Communications*, Vol. 47, No. 10, pp. 1449–1454, October 1999 and R. Richardson and R. L. Urbanke, "*Efficient encoding of low-density parity-check codes,*" *IEEE Trans. on Information Theory, Vol.* 47., No. 2, pp. 638–656, February 2001, the parity-check matrix is again generated by a random construction and a triangular or "approximate triangular" form is imposed to allow efficient encoding. These constructions each lead to linear-time encodable LDPC codes. However, they have a number of drawbacks, including:

(a) Randomly constructed parity-check codes cannot be specified via a small number of parameters. In other words, all the positions of the nonzero elements of the parity-check matrix must be individually given;

(b) preprocessing is sometimes required to bring the parity-check matrix into triangular or approximate triangular form; and, (c) the codes obtained result in loss in performance as compared with randomly constructed LDPC codes.

In would be desirable to provide parity-check matrices that lead to LDPC codes having linear-time encoding complexity. It would also be desirable to provide parity-check matrices that are fully deterministic and can be specified via a small number of parameters. It would also be desirable to provide parity-check matrices that require a minimum amount of, or no, preprocessing.

SUMMARY OF THE INVENTION

In accordance with the present invention, there is now provided a method for low-density parity-check (LDPC) encoding of data, the method comprising: defining a first M×N parity check matrix representative of the low density parity check code; generating, based on the first parity check matrix, a second parity check matrix having an M×M triangular sub-matrix; and, mapping the data into an LDPC code word based on the second parity check matrix.

The method may further comprise eliminating 4-cycles from the second matrix. Alternatively, the defining of the parity check matrix may comprise cyclically shifting of rows of the first matrix to eliminate 4-cycles from the outset. Preferred embodiments of the present invention comprise setting entries along the main diagonal of the M×M triangular sub-matrix to the same value.

Viewing the present invention from another aspect, there is now provided apparatus for low-density parity-check (LDPC) encoding of data, the apparatus comprising: matrix definition logic for defining a first M×N parity check matrix; a triangular matrix generator for generating a second parity check matrix based on the first parity check matrix; the second parity check matrix having an M×M triangular sub-matrix; and, an encoder for mapping the data into an LDPC code word based on the second parity check matrix.

Viewing the present invention from yet another aspect, there is now provided a computer program product for low-density parity-check (LDPC) encoding of data, the computer program product comprising a machine readable storage medium storing computer program code which, when loaded in a programmable data processor, configures the processor to perform the steps of: defining a first M×N parity check; generating, based on the first parity check matrix, a second parity check matrix having an M×M triangular sub-matrix; and, mapping the data into an LDPC code word based on the second parity check matrix.

The present invention also extends to a data transmitter for transmitting data received from an information source via a communications channel, the data being encoded by the transmitter into a low-density parity-check (LDPC) code word, the transmitter comprising: matrix definition logic for defining a first M×N parity check; a triangular matrix generator for generating a second parity check matrix based on the first parity check matrix; the second parity check matrix having an M×M triangular sub-matrix; and, an encoder for mapping the data into an LDPC code word based on the second parity check matrix.

The present invention further extends to a data storage system for storing data received from an information source in a data storage channel, the data being encoded by the system into a low-density parity-check (LDPC) code word, the system comprising: matrix definition logic for defining a first M×N parity check matrix; a triangular matrix generator for generating a second parity check matrix based on the first parity check matrix; the second parity check matrix having an M×M triangular sub-matrix; and, an encoder for mapping the data into an LDPC code word based on the second parity check matrix.

Parity-check matrices thus provided lead to LDPC codes having linear-time encoding complexity. Such matrices are fully deterministic and can be specified via a small number of parameters. Also, such matrices require a minimum amount of, or no, preprocessing. The performance of the obtained codes is as good as or better than the randomly constructed LDPC codes.

Preferred embodiments of the present invention to be described shortly utilise parity-check matrix constructions for so-called "array codes". Array codes are described by M. Blaum, P. Farrell, and H. van Tilborp, *"Array codes," in Handbook of Coding Theory*, V. S. Pless and W. C. Huffman Eds., Elsevier 1998. The direct application of array-code constructions to obtain LDPC parity-check matrices are described in J. L. Fan, *"Array codes as low-density parity-check codes," Proc. Int. Symp. on Turbo Codes*, Brest, France, pp. 543–546, September 2000, and E. Eleftheriou and S. Oelcer, *"LDPC codes for G.dmt.bis and G.lite.bis," International Telecommunication Union*, ITU-T, Study Group 15/Question 4, Temporary Document CF-060, Clearwater, Fla., 8–12 Jan. 2001. Although the codes in the last mentioned two references are specified via a small number of parameters, they are not linear-time encodable.

BRIEF DESCRIPTION OF THE DRAWINGS

Preferred embodiments of the present invention will now be described, by way of example only, with reference to the accompanying drawings, in which.

DETAILED DESCRIPTION OF ILLUSTRATIVE EMBODIMENT

Figure 1:
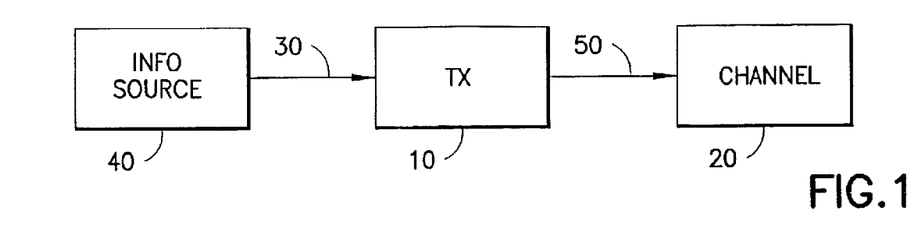
FIG. 1 is a block diagram of a communications system.

Referring first to FIG. 1, a preferred embodiment of the present invention comprises a transmitter 10 for connection to a receiver (not shown) via a communication channel 20 such a Digital Subscriber Line (DSL) communications channel. In operation, the transmitter 10 receives a sequence of information bits 30 from an information source 40 such as a computer system, mobile telephone, fixed line telephone, or similar data communications endpoint. The transmitter 10 converts the information bits 30 into symbols 50 for transmission to the receiver via the channel 20.

Figure 2:
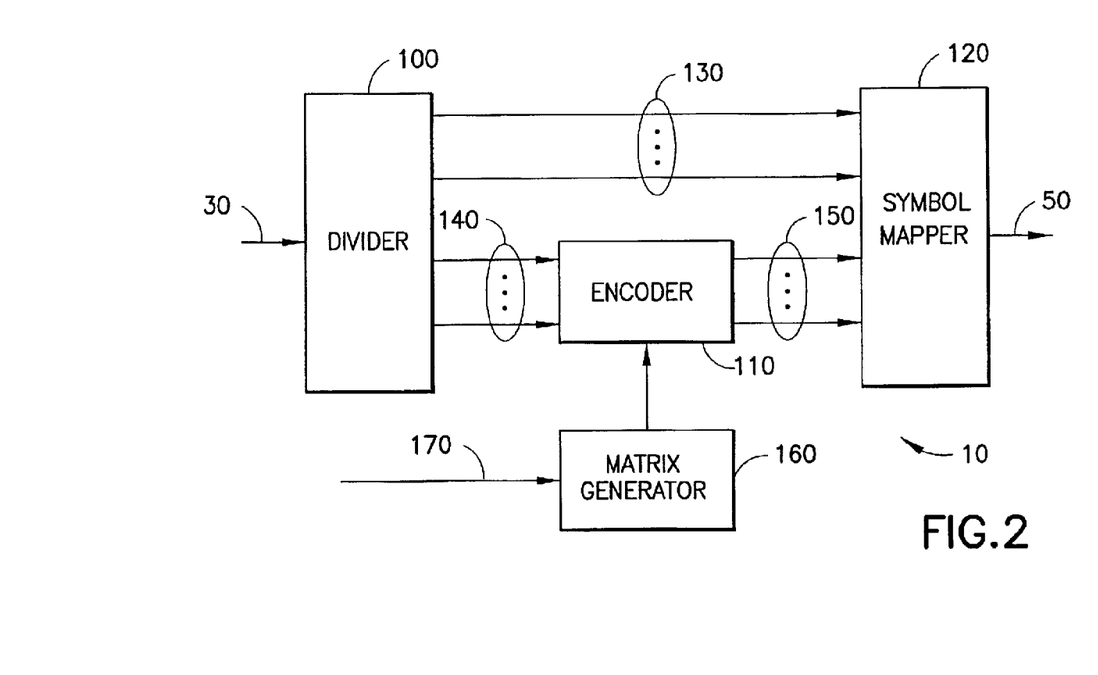
FIG. 2 is a block diagram of a transmitter for the communications system.

Referring now to FIG. 2, in a particularly preferred embodiment of the present invention, the transmitter 10 comprises a divider 100, a block encoder 110 connected to the divider 110 and a symbol mapper 120 connected to the block encoder 110 and the divider 100. A parity check matrix generator 160 is connected to the encoder 110. In operation, at each modulation instant, the divider 100 divides a set of information bits 30 from the information source 40 to be communicated into a first group 130 and a second group 140. The block encoder 110 encodes the second group 140 to generate a block code 150 based on a parity check matrix provided by the matrix generator. The parity check matrix is generated by the matrix generator based on code parameters 170. The symbol mapper 120 selects a subset of symbols in a constellation of symbols in dependence on the block code 150 according to a Gray-coded mapping function. The symbol mapper 120 also selects a symbol within the subset in dependence on the first group 130 according to a Gray-coded mapping function. The selected Symbol 50 is then communicated to the receiver via the channel 20. The divider 100 may implemented by a shift register or similar logical function. It will be appreciated that the transmitter 10 may be implemented by hardwired logic, by a general purpose processor or dedicated digital signal processor programmed with computer program code, or by a combination of hardwired logic and computer program code.

Figure 3:
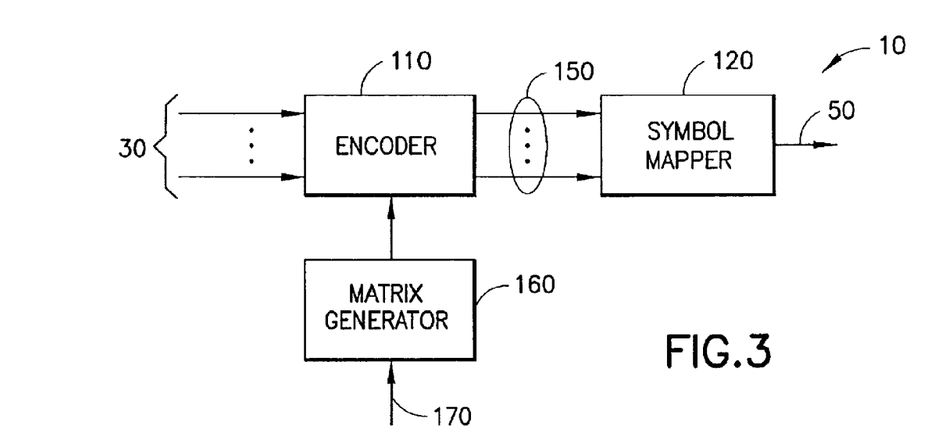
FIG. 3 is a block diagram of another transmitter for the communications system.

Referring now to FIG. 3, in a modification to the transmitter 10 herein before described with reference to FIG. 2, the divider 100 is omitted and the block encoder 110 encodes all the information bits 30 received from the information source 40 to generate the block code 150. The symbol mapper 120 selects a symbol in a constellation of symbols in dependence on the block code 150 according to a Gray-coded mapping function. The selected symbol 50 is then communicated to the receiver via the channel 20.

Figure 4:
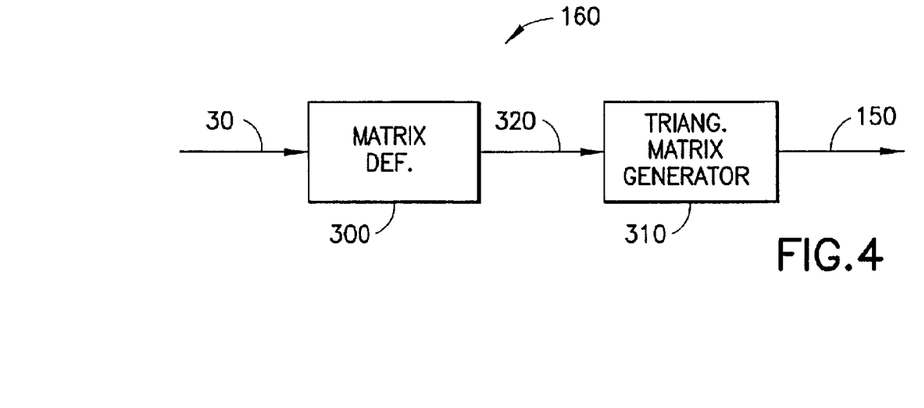
FIG. 4 is a block diagram of an matrix generator for the transmitter.
Figure 5:
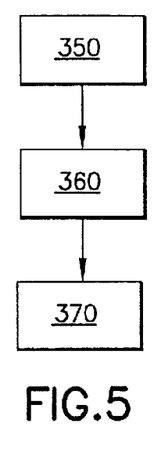
FIG. 5 is a flow chart corresponding to an encoder function of the transmitter

With reference to FIG. 4, in a preferred embodiments of the present invention, the matrix generator 160 comprises matrix definition logic 300 connected to a triangular matrix generator 310. With reference to FIG. 5, in operation, at step 350, the matrix definition logic 300 defines a first M×N parity check matrix 320 based on input code parameters 170. At step 360, the triangular matrix generator 310 generates a second matrix based on the first matrix. The second matrix has an M×M triangular sub-matrix. At step 370, the second matrix is supplied from the matrix generator 160 to the encoder 110. Data input to the encoder 110 is then mapped LDPC code words based on the second matrix. Two approaches to definition of the parity check matrix and the generation of the triangular matrix in preferred embodiments of the present invention will now be described with reference to FIGS. 6 and 7.

Figure 6:
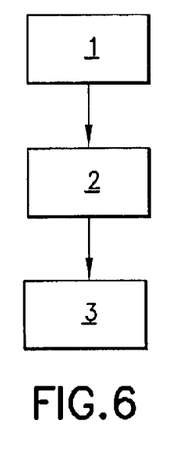
FIG. 6 is a flow chart corresponding to the matrix generator.

Referring to FIG. 6, in a preferred embodiment of the present invention, matrix generation comprises three steps, 1, 2, and 3. In step 1, a matrix H is defined according to the definition of parity-check matrices for array codes. Step 2 is a triangularization step that deterministically modifies the matrix H to achieve an upper-triangular structure. Step 3 includes a simple procedure to eliminate 4-cycles that may have been introduced in the second step.

Step 1: Definition of H

The array-code like LDPC parity check matrix H is defined by three parameters: a prime number p and two integers k and j such that k,j≦p. The matrix H has dimensions jp×kp and is given by $$H = \begin{bmatrix} I & I & I & \cdots & I \\ I & a & a^2 & \cdots & a^{k-1} \\ I & a^2 & a^4 & \cdots & a^{2(k-1)} \\ \vdots & \vdots & \vdots & \ddots & \vdots \\ I & a^{j-1} & a^{2(j-1)} & \cdots & a^{(j-1)(k-1)} \end{bmatrix},$$

where I is the p×p identity matrix and α is a p×p permutation matrix representing a single left or right cyclic shift. For example:

$$a = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} \text{ or } a = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix}.$$

The parameters j and k provide the column and row weight of H, respectively. By construction, the matrix H is 4-cycle free. In other words, there are no two rows that have overlapping ones in more than one position.

H represents the parity-check matrix of a family of LDPC codes with code word length N=kp and number of parity checks M=jp. An LDPC code with code word length N'<N or number of parity checks M'<M is easily obtained by discarding the N-N' rightmost columns and the M-M' lowest rows of H. The resulting M'×N' matrix is then used instead of H in steps 2 and 3, with obvious modifications to the sizes of the matrices involved.

Step 2: Triangularization of H

Let H be represented in the block-matrix form $$H = [H_1 | H_2]$$

where $H_1$ has dimensions jp×jp and $H_2$ has dimensions jp×(k-j)p. Let U be the jp×jp upper-triangular matrix obtained from $H_1$ by replacing each element on the main diagonal of $H_1$ with a 1 and by setting all the elements below the main diagonal to 0. The jp×kp matrix $$H_u = [U | H_2]$$

defines the parity-check matrix of a linear-time encodable LDPC code.

Note that, although the matrix H is 4-cycle free by construction, $H_U$ may not be free of 4-cycles due to the introduction of the upper triangular matrix U. However, 4-cycles are easily detected and eliminated as demonstrated in the next step.

Step 3: Elimination of 4-cycles

Let $A = H_U \cdot H^T_U$, where T denotes matrix transposition. The diagonal element $\alpha_{m,m}$, m=1, ..., jp of A gives the Hamming weight of row m, i.e., the number of symbols checked by the parity-check m of matrix $H_U$. The off-diagonal element $\alpha_{m,n}$, m,n=1, ..., jp, m≠n, gives the number of symbols checked by both parity-check m and parity-check n. In the absence of 4-cycles, $\alpha_{m,n}$≦1.

Therefore, to ensure that the parity-check matrix is free of 4-cycles:

(a) Compute the lower-triangular part of $A = H_u \cdot H^T_u$.
(b) If $\alpha_{m,n}>1$, (m,n=1, ...,jp; m<n), set the (n,m)-th element of $H_U$ equal to zero.

Denote by $\check{H}_U$ the matrix that is obtained at the end of Step 3. The LDPC code defined by $\check{H}_U$ has code word length N=kp, number of parity checks M=jp, and information block length K=(k-j)p. Linear-time encodability using $\check{H}_U$ is shown in the next section.

Efficient encoding is achieved directly from the parity-check matrix $\check{H}_U$ without the need to compute the generator matrix of the code. Recall that since LDPC codes are linear block codes, an N-tuple x is an LDPC code word if and only if $\check{H}_U \cdot x = 0$, where 0 is the M×1 null vector. The vector x may be expressed in the form $$x = \begin{bmatrix} p \\ s \end{bmatrix}$$

where the jp×1 vector p represents the parity part and the (k-j)p×1 vector s represents the systematic part of the code word x. The jp parity bits in p are obtained in a recursive manner by employing $$\check{H}_U \cdot \begin{bmatrix} p \\ s \end{bmatrix} = 0$$

and exploiting the upper-triangular form of $\check{H}_U$. To demonstrate this, let both vectors p and s be split into p×1 sub-vectors $$p = \begin{bmatrix} p_1 \\ p_2 \\ \vdots \\ p_j \end{bmatrix} \text{ and } s = \begin{bmatrix} s_1 \\ s_2 \\ \vdots \\ s_{k-j} \end{bmatrix},$$

where $p_i = \{p_{i,n}; n=1,2, \ldots, p\}$, i=1,2, ..., j and $s_i = \{s_{i,n}; n=1,2, \ldots, p\}$, i=1,2, ..., k-j. Then the elements of $p_m$ are obtained for m=j, j-1, ..., 1 by the set of recursions $$p_{m,p} = \sum_{l=m+1}^{j} p_{l,\ldots} + \sum_{l=1}^{k-j} s_{l,\ldots}$$

$$p_{m,p-1} = (p_{m,p}) + \sum_{l=m+1}^{j} p_{l,\ldots} + \sum_{l=1}^{k-j} s_{l,\ldots}$$

$$\vdots$$

$$p_{m,1} = (p_{m,\ldots}) + \sum_{l=m+1}^{j} p_{l,\ldots} + \sum_{l=1}^{k-j} s_{l,\ldots}$$

where the second sub-indices of $p_l$, ..., and $s_l$, ..., which depend on the particular values assumed by the power of the matrix α, have been omitted to avoid notational burden. The terms shown in parentheses may actually not be present, depending, again, on the particular values of the power of the matrix α.

The above encoding process thus takes advantage of the triangular structure of the parity-check matrix $\check{H}_U$ as well as of its sparsity. It can be shown that encoding requires about $$\frac{N}{2}\left[j(1+r)+\left(1-\frac{4}{j}\right)(1-r)\right]$$

XOR operations, where r is the rate of the code.

Figure 7:
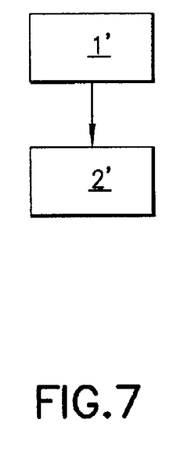
FIG. 7 is another flow chart corresponding to the matrix generator.

Referring now to FIG. 7, a modification to the approach herein before described with reference to FIG. 6 comprises two steps, 1' and 2'. Steps 1' and 2' will now described in detail.

Step 1': Definition of $H^S$

A matrix $H^S$ is defined by cyclically shifting, in a block-wise manner, the rows of the matrix H. The amount of cyclic shift for each block-row is such that the jp×jp leftmost subblock of $H^S$ contains the identity matrix I along its diagonal:

$$H^S = \begin{bmatrix} I & I & I & \cdots & I & I & \cdots & I \\ a^{k-1} & I & a & \cdots & a^{j-2} & a^{j-1} & & a^{k-2} \\ a^{2(k-2)} & a^{2(k-1)} & I & \cdots & a^{2(j-3)} & a^{2(j-2)} & & a^{2(k-3)} \\ \vdots & \vdots & \vdots & \ddots & \vdots & \vdots & & \vdots \\ a^{(j-1)(k-j+1)} & a^{(j-1)(k-j+2)} & \cdots & \cdots & I & a^{j-1} & \cdots & a^{(j-1)(k-1)} \end{bmatrix}.$$

Since $H^S$ has been obtained from H via cyclic shifts only, it has column and row weights given by j and k, respectively, and is free of 4-cycles.

Step 2': Triangularization of $H^S$

The matrix $H^S$ is triangularized by replacing with zeros the lower-triangular elements of its jp×jp leftmost subblock. As a result, the matrix $H^S_U$ is obtained:

$$H^S_U = \begin{bmatrix} I & I & I & \cdots & I & I & \cdots & I \\ O & I & a & \cdots & a^{j-2} & a^{j-1} & & a^{k-2} \\ O & O & I & \cdots & a^{2(j-3)} & a^{2(j-2)} & & a^{2(k-3)} \\ \vdots & \vdots & \vdots & \ddots & \vdots & \vdots & & \vdots \\ O & O & \cdots & O & I & a^{j-1} & \cdots & a^{(j-1)(k-1)} \end{bmatrix},$$

where O is the p×p null matrix.

The LDPC code defined by $H^S_U$ has code word length N=kp, number of parity checks M=jp, and information block length K=(k−j)p. Also, $H^S_U$ is 4-cycle free. Clearly, LDPC codes defined by $H^S_U$ are linear-time encodable.

An LDPC code with code word length N'<N or number of parity checks M'<M is easily obtained by discarding the N−N' rightmost columns and the M−M' lowest rows of $H^S_U$.

Efficient encoding is achieved in the same manner as herein before described with reference to the approach herein before described with reference to FIG. 6. It can be shown to require $$\frac{N}{2}[r(j+3)+(j-3)]$$

XOR operations, where r is the rate of the code.

The parity-check matrices obtained in the embodiments of the present invention herein before described with reference to FIGS. 6 and 7 have a triangular form. In references D. J. C. MacKagy, S. T. Wilson, and M. C. Davey, "*Comparison of constructions of irregular Gallager codes,*" *IEEE Trans. on Communications*, Vol. 47, No. 10, pp. 1449–1454, October 1999 and R. Richardson and R. L. Urbanke, "*Efficient encoding of low-density parity-check codes,*" *IEEE Trans. on Information Theory*, Vol. 47., No. 2, pp. 638–656, February 2001, it is shown that fast encoding is also possible for LDPC codes having a parity-check matrix in "approximate triangular" form $$\begin{bmatrix} C & D \\ T & E \end{bmatrix},$$

where C, D, E and T are matrices of appropriate dimensions and T matrix is upper-triangular. Such a form can be efficiently obtained by generalizing the approaches herein before described with reference to FIGS. 6 and 7

For example, if the approach herein before described with reference to FIG. 6 is followed, then to generate an approximate triangular form, Step 1 remains the same, but the matrix H is now equivalently written in block-matrix form as $$H = \begin{bmatrix} H_3 & H_4 \\ H_5 & H_6 \end{bmatrix},$$

where $H_5$ is a tp×tp matrix, with the integer t≦j, and the matrices $H_3$, $H_4$ and $H_6$ have appropriate dimensions. A triangularizaton step similar to Step 2 is the applied to $H_5$. Let $U_5$ be the tp×tp upper-triangular matrix obtained from $H_5$ by replacing each element on the main diagonal of $H_5$ with a 1 and by setting all the elements below the main diagonal to 0.

The jp×kp matrix $$\begin{bmatrix} H_3 & H_4 \\ U_5 & H_6 \end{bmatrix},$$

is in approximate triangular form and therefore defines the parity-check matrix of a fast encodable LDPC code according to the aforementioned references D. J. C. MacKay, S. T. Wilson, and M. C. Davey, "*Comparison of constructions of irregular Gallager codes,*" *IEEE Trans. on Communications*, Vol. 47, No. 10, pp. 1449–1454, October 1999 and R. Richardson and R. L. Urbanke, "*Efficient encoding of low-density parity-check codes,*" *IEEE Trans. on Information Theory*, Vol. 47., No. 2, pp. 638–656, February 2001. Step 3 then is applied to this approximate triangular matrix to eliminate possible 4-cycles.

Clearly, the matrix H in Step 1 can be rowwise and columnwise truncated to achieve specific values for the code word length and number of parity checks.

As indicated earlier, the approach herein before described with reference to FIG. 7 can also be used to obtain a parity-check matrix in approximate triangular form. To this end, Step 1' is altered by cyclically shifting to the right the t−1 lower block-rows of the matrix $H^S$. That is, the lowest block-row is shifted by t−1 positions, the next upper block-row by t−2 positions, etc. Then, Step 2' is applied, but only to the tp×tp lower-left submatrix of the so-obtained matrix, resulting in a new matrix with approximate triangular form. The overall matrix is then in approximate triangular form and free of 4-cycles and can directly be used for fast LDPC encoding following D. J. C. MacKay, S. T. Wilson, and M. C. Davey, "*Comparison of constructions of irregular Gallager codes,*" *IEEE Trans. on Communications*, Vol. 47, No. 10, pp. 1449–1454, October 1999 and R. Richardson and R. L. Urbanke, "*Efficient encoding of low-density parity-check codes,*" *IEEE Trans. on Information Theory*, Vol. 47., No. 2, pp. 638–656. February 2001.

Again, the matrix obtained at the end of Step 2' can be rowwise and columnwise truncated to achieve specific values for the code word length and number of parity checks.

In some embodiments of the present invention, the parity check matrix may be defined by the matrix definition logic 300 upon connection of the transmitter 10 to the receiver via the communications channel 20. For example, the matrix may be built by the matrix definition logic 300 on connection based on dimensions negotiated between the endpoints of the channel 20. Specifically, the parity check matrix may be determined based on supply of the code parameter 170 to the transmitter 10 from the receiver 20. In other embodiments of the present invention, the parity check matrix may be defined by the matrix definition logic 300 in advance of a connection being established. For example, one or more parity check matrices may be preset within the matrix definition logic 300, with the or each preset matrix having a preset code length (number of columns) and a preset number of parity checks (number of rows). In embodiments having multiple preset matrices, an appropriate matrix is selected to the matrix definition logic 300 on establishment of the connection. Such a selection may be performed, for example, based on a negotiation between the endpoints of the channel 20 as herein before described.

Figure 8:
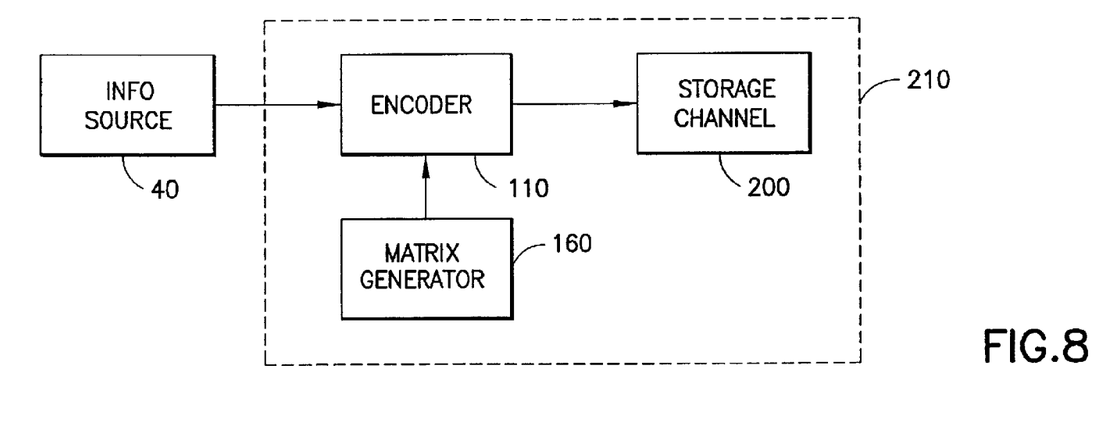
FIG. 8 is a block diagram of a data storage system.

Preferred embodiments of the present invention have been herein before described with reference to communications systems. However, the present invention is not limited in application to such systems. For example, referring to FIG. 8, the embodiments of the encoder 110 herein before described may also be employed in a data storage system 210 for storing data from the information source 40 in a storage channel such as a hard disk storage channel.

Figure 9:
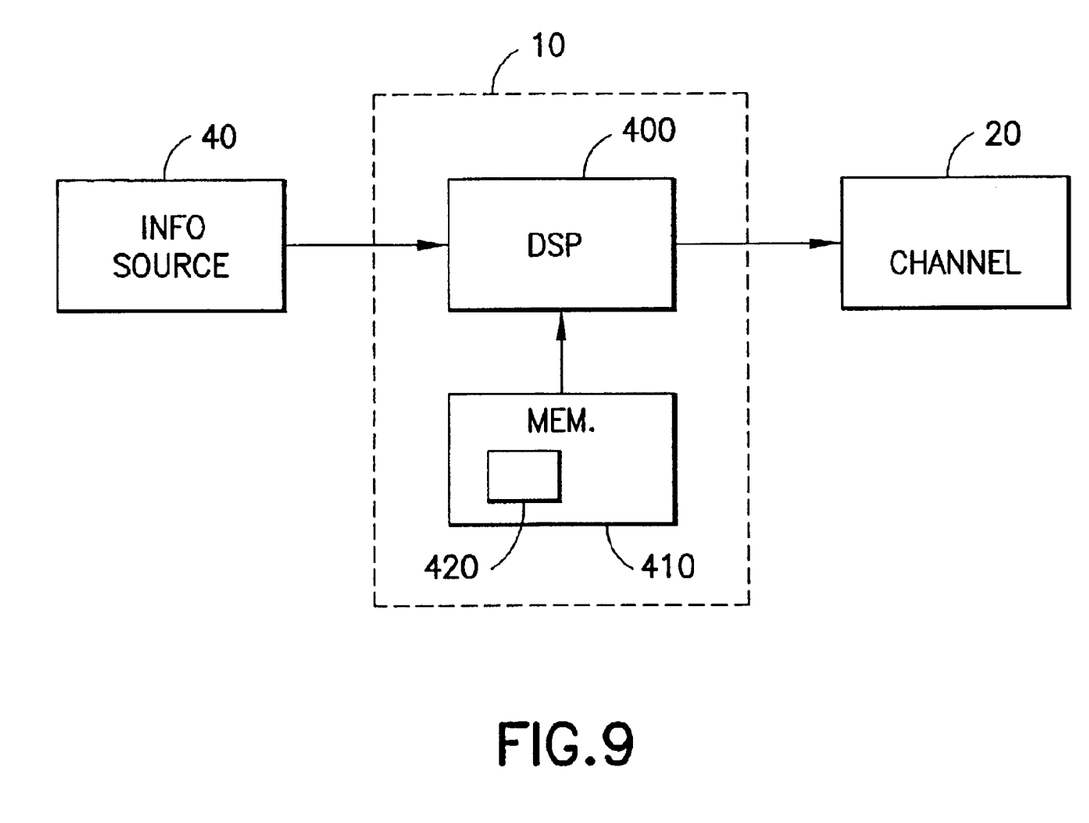
FIG. 9 is a block diagram of another example of a transmitter for the communications system.

It will be appreciated that the examples of the transmitter 10, encoder 110, and matrix generator 160 herein before described may each be implemented by hardwired logic, by a general purpose processor or dedicated digital signal processor programmed with computer program code, or by a combination of hardwired logic and computer program code. For example, referring to FIG. 9, in the data communications system herein before described with reference to FIG. 2, the transmitter 10 may comprise a programmable digital signal processor (DSP) 400 connected to a memory 410, with computer program code 420 stored in the memory 420 which, when executed by the DSP 400, configures the DSP 400 to perform the steps of the method herein before described with reference to FIG. 5.

While the invention has been described herein with reference to preferred embodiments, it will be appreciated by those skilled in the art that various changes in form and detail may be therein without departing from the scope of the invention.

What is claimed is:

1. A method for low-density parity-check (LDPC) encoding of data, the method comprising:
   defining a first M×N parity check matrix, H=[H1] [H2];
   generating, based on the first parity check matrix, a second parity check matrix having an M×M triangular sub-matrix by replacing [H1] with a triangular matrix; and,
   mapping the data into an LDPC code word based on the second parity check matrix.

2. A method as claimed in claim 1, further comprising eliminating 4-cycles from the second matrix.

3. Apparatus for low-density parity-check (LDPC) encoding of data, the apparatus comprising:
   matrix definition logic for defining a first M×N parity check, H=[H1] [H2];
   a triangular matrix generator for generating a second parity check matrix based on the first parity check matrix the second parity check matrix having an M×M triangular sub-matrix by replacing [H1] with a triangular matrix; and,
   an encoder for mapping the data into an LDPC code word based on the second parity check matrix.

4. Apparatus as claimed in the claim 3, wherein the triangular matrix generator, in use, eliminates 4-cycles from the second matrix.

5. A computer program product for low-density parity-check (LDPC) encoding of data, the computer program product comprising a machine readable storage medium storing computer program code which, when loaded in a programmable data processor, configures the processor to perform the steps of:
   defining a first M×N parity check matrix, H=[H1] [H2];
   generating, based on the first parity check matrix, a second parity check matrix having an M×M triangular sub-matrix by replacing [H1] with a triangular matrix; and,
   mapping the data into an LDPC code word based on the second parity check matrix.

6. A computer program product as claimed in claim 5, further comprising eliminating 4-cycles from the second matrix.

7. A data transmitter for transmitting data received from an information source via a communications channel, the data being encoded by the transmitter into a low-density parity-check (LDPC) code word, the transmitter comprising: matrix definition logic for defining a first M×N parity check matrix, H=[H1] [H2]; a triangular matrix generator for generating a second parity check matrix based on the first parity check matrix; the second parity check matrix having an M×M triangular sub-matrix by replacing [H1] with a triangular matrix; and, an encoder for mapping the data into an LDPC code word based on the second parity check matrix.

8. A data storage system for storing data received from an information source in a data storage channel, the data being encoded by the system into a low-density parity-check (LDPC) code word, the system comprising: matrix definition logic for defining a first M×N parity check matrix, H=[H1] [H2]; a triangular matrix generator for generating a second parity check matrix based on the first parity check matrix; the second parity check matrix having an M×M triangular sub-matrix by replacing [H1] with a triangular matrix; and, an encoder for mapping the data into an LDPG code word based on the second parity check matrix.

9. A method for low-density parity-check (LDPC) encoding of data, the method comprising the steps of:
   defining a matrix H;
   generating a matrix $H^S$ by cyclically shifting the rows of matrix H until the leftmost subblock of $H^S$ contains the identity matrix I along its diagonal;
   triangularizing $H^S$ by replacing with zeroes all elements below the identity matrix I along the diagonal; and
   mapping the data into an LDPC code word based on the triangularized $H^S$.

10. A method as claimed in claim 9, comprising setting entries along the main diagonal of the M×M triangular sub-matrix to the same value.

11. Apparatus for low-density parity-check (LDPC) encoding of data comprising:
   a matrix definition component for defining a matrix H;
   a matrix generating component for generating a matrix $H^S$ by cyclically shifting the rows of matrix H until the leftmost subblock of $H^S$ contains the identity matrix I along its diagonal and for triangularizing $H^S$ by replacing with zeroes all elements below the identity matrix I along the diagonal; and an encoder for mapping the data into an LDPC code word based on the triangularized $H^S$.

12. Apparatus as claimed in claim 11, wherein the matrix definition logic, in use sets entries along the main diagonal of the M×M sub-matrix to the same value.

13. A computer program product for low-density parity-check (LDPC) encoding of data, the computer program product comprising a machine readable storage medium storing computer program code which, when loaded in a programmable data processor, configures the processor to perform low-density parity-check (LDPC) encoding of data, the method comprising the steps of:

defining a matrix H;

generating a matrix $H^S$ by cyclically shifting the rows of matrix H until the leftmost subblock of $H^S$ contains the identity matrix I along its diagonal;

triangularizing $H^S$ by replacing with zeroes all elements below the identity matrix I along the diagonal; and mapping the data into an LDPC code word based on the triangularized $H^S$.

14. A computer program product as claimed in claim 13, comprising setting entries along the main diagonal of the M×M triangular sub-matrix to the same value.

* * * * *